United States Patent [19]

Lievin et al.

[11] Patent Number: 5,278,094
[45] Date of Patent: Jan. 11, 1994

[54] METHOD OF MANUFACTURING A PLANAR BURIED HETEROJUNCTION LASER

[75] Inventors: Jean-Louis Lievin, Paris; Lionel Le Gouezigou, Le Val Saint Germain; Christine Labourie, Villejuif; Pierre Doussiere, Saint Germain Les Arpajons, all of France

[73] Assignee: Alcatel N.V., Amsterdam, Netherlands

[21] Appl. No.: 857,383

[22] Filed: Mar. 25, 1992

[30] Foreign Application Priority Data

Mar. 28, 1991 [FR] France ................. 91 03769

[51] Int. Cl.$^5$ ........................... H01L 21/20
[52] U.S. Cl. ..................... 437/126; 437/129; 437/133; 362/43; 362/45
[58] Field of Search ............ 437/129, 130, 131, 132, 437/133, 89, 126; 372/43; 372/46; 437/126

[56] References Cited

U.S. PATENT DOCUMENTS

| | | | |
|---|---|---|---|
| 4,111,725 | 9/1978 | Cho et al. | 437/129 |
| 4,994,143 | 2/1991 | Kim | 437/129 |
| 5,128,276 | 7/1992 | Ambrosius et al. | 372/46 |
| 5,138,626 | 8/1992 | Yap | 437/129 |
| 5,143,863 | 9/1992 | Ohnaka et al. | 437/129 |
| 5,148,439 | 9/1992 | Wünstel et al. | 372/45 |

FOREIGN PATENT DOCUMENTS 60-202976 10/1985 Japan .
60-254688 12/1985 Japan .
63-177493 7/1988 Japan .

Primary Examiner—Robert Kunemuno
Assistant Examiner—Ramamohan Rao Paladugu
Attorney, Agent, or Firm—Robbins, Berliner & Carson

[57] ABSTRACT

In a method of manufacturing a planar buried heterojunction laser a semiconductor structure is etched to delimit a laser stripe upstanding on a confinement layer. Lateral layers surround the laser stripe to constitute the planar buried heterojunction laser. They are formed by a non-selective growth method not only at the sides of said stripe but also on top of said stripe to create a parasitic projection. These layers and the projection are subsequently covered with a contact localizing layer. The projection is then removed to form a contact window in the contact localizing layer for localizing an electrical contact on top of the laser stripe. The invention finds a particular application in the manufacture of lasers for fiber optic telecommunication systems.

9 Claims, 4 Drawing Sheets

METHOD OF MANUFACTURING A PLANAR BURIED HETEROJUNCTION LASER

BACKGROUND OF THE INVENTION

1. Field of the invention

The present invention concerns the manufacture of a buried stripe semiconductor laser. The semiconductor structure of a laser of this kind is known internationally as a "planar buried heterojunction" (PBH) structure.

2. Description of the prior art

One prior art method of manufacturing a PBH laser includes so-called layer growing steps during which the semiconductor layer thickness is increased by epitaxial deposition of the material of the layers. This process is briefly as follows (see FIG. 1):

Growth of binary composition, then quaternary composition and then binary composition semiconductor layers on a substrate. This produces a double heterostructure.

Growth of a ternary composition contact layer having a forbidden band energy that is lower than that of the previous binary composition layer.

Definition of a laser stripe in the quaternary composition layer by chemical etching from the top surface of the substrate using a dielectric mask.

Growth of two lateral semiconductor layers to surround and bury the laser stripe.

Localized deposition of a contact layer through a window formed on top of the laser stripe in a dielectric layer previously deposited for this purpose onto the top surface of the substrate.

The lateral layer growth step conventionally employs so-called "selective" growth methods which have various drawbacks including a limited yield. However, they enable localized growth of layers on the semiconductor material with no deposit of material on top of the laser stripe. This requires retaining the mask which was used to define the laser stripe during this growth step. This growth step is carried out at temperatures above 500° C. For this reason the dielectric mask used is formed by depositing and etching a dielectric layer.

This prior art process is described, for example, in an article by M. HIRAO et al "Long wavelength InGaAsP/InP buried heterostructure laser", J. Opt commun., 1980, 1, pp. 10-14.

Laser semiconductors are known in some cases to show deterioration of their properties with time and this may be the result of pollution during manufacture.

Also, forming a contact localizing window to enable localized injection of current into the laser stripe requires at least one photo-etching stage requiring delicate realignment.

An NTT document, PATENT ABSTRACTS OF JAPAN vol.12, No.449(E-686) (3296) Nov. 25, 1988, abstract of document JP-A-63 177 493(NTT) July 21, 1988, describes the manufacture of a planar buried heterojunction laser in which lateral layers are formed by a non-selective growth method which grows the semiconductor material not only at the sides of the laser stripe but also on top of it to create a parasitic projection. This is subsequently removed. No arrangement is described for localizing the electrical contact on top of the laser stripe. If injection of current into the laser stripe is not localized, the performance of the laser is seriously degraded.

The objects of the present invention include:

simplifying a method of manufacturing a planar buried heterojunction semiconductor laser, enabling the use of high-yield growth processes within this method, reducing the risk of pollution during formation of the semiconductor structure of the component, avoiding realignment problems associated with contact localization on the component, and generally, enabling the use in the method of processes which may be advantageous as compared with processes previously employed.

SUMMARY OF THE INVENTION

After etching to delimit a protuberance on a confinement layer, lateral layers to surround said protuberance are formed by a non-selective growth method which forms a deposit not only at the sides of said protuberance but also on top of it to create a parasitic projection. A contact localizing layer is then grown on the surface of said lateral layers and said projection. Said projection is then used to form a contact window in the layer whose contours are defined by those of the projection. In one embodiment the projection may be removed by attack through said window. In all embodiments said window enables subsequent localization of an electrical contact above said protuberance.

This protuberance includes the laser stripe.

Eliminating the operations to form a dielectric mask simplifies the manufacture of the component. The absence of any such mask avoids disturbances that it might otherwise introduce during the growth of the lateral layers and which result in particular from the fact that the dielectric material employed may partially decompose and partially release pollutant substances which may be trapped in pores of the material. This reduces the risk of degrading the properties of the component. Also, non-selective growth methods enable the yield of the process to be increased.

Another advantage of the invention is that the combination of removing the projection and forming the current localizing window constitutes a simple and automatic means of aligning said window with the laser stripe. Because of this advantage it is not necessary to use lithographic means to achieve such alignment and this significantly reduces the cost of manufacture and eliminates alignment inaccuracies which could compromise the performance of the final component.

The manner in which the present invention may be carried into effect will now be described by way of non-limiting example only and with reference to the accompanying drawings. If the same item appears in more than one figure it is always designated by the same reference symbol. Where a layer is designated by a reference number, a part of that layer is denoted by the same reference number with the suffix A.

DETAILED DESCRIPTION OF THE INVENTION

The known method will first be described. The only object of this description is to make it possible later in this document to appreciate the differences between this method and the present invention. The description will therefore be an outline description.

Figure 1A:
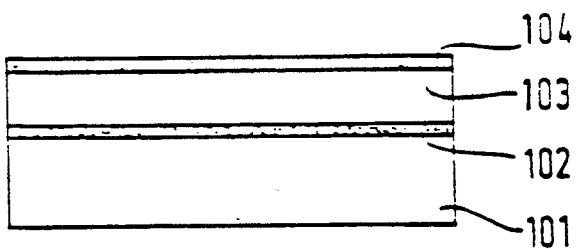
FIGS. 1A through 1G are views in cross-section of a semiconductor substrate after successive stages in manufacturing a laser by a known method.

In this method an n-doped InP indium phosphide lower confinement layer is grown on a substrate (not shown). Subsequent to various known operations that do not relate to the present invention, a quaternary composition active layer 102 is grown on this layer followed by a p-doped InP upper confinement layer 103 (FIG. 1A) and a ternary composition contact layer 104.

Figure 1B:
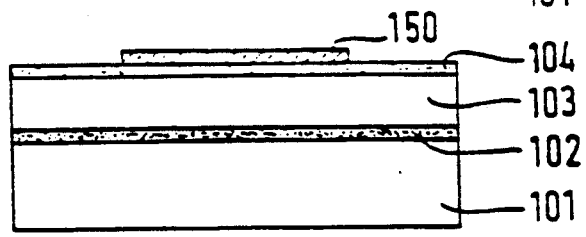

A dielectric mask 150 (FIG. 1B) is formed by depositing and etching a dielectric layer.

Figure 1C:
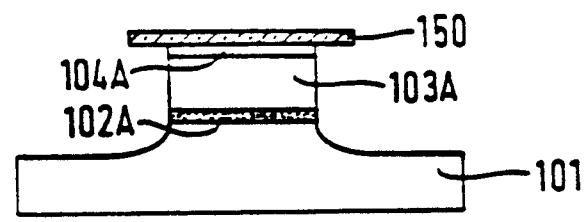

Subsequent chemical etching defines a laser stripe 102A consisting of the remaining part of the active layer 102 (FIG. 1C) on top of which are partial confinement and contact layers 103A and 104A.

Figure 1D:
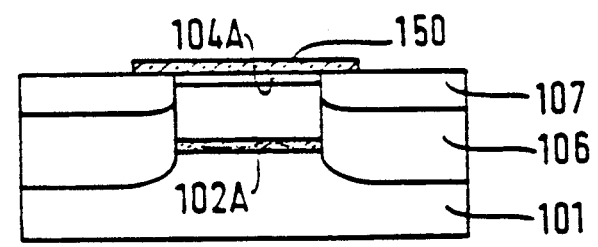
Figure 1E:
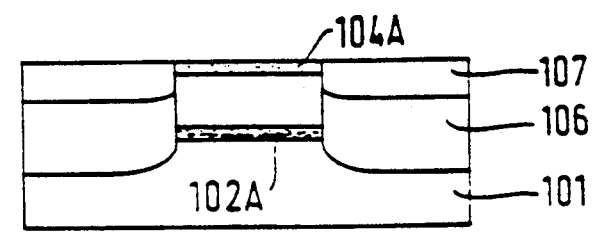
Figure 1F:
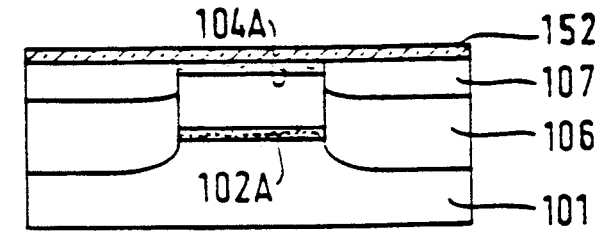
Figure 1G:
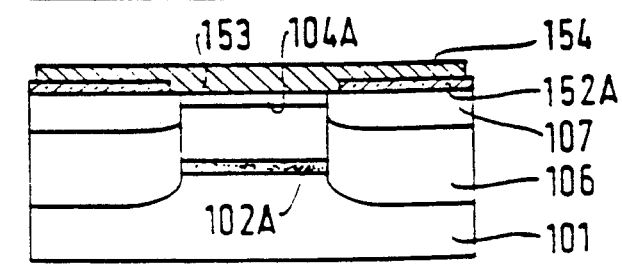
Figure 2:
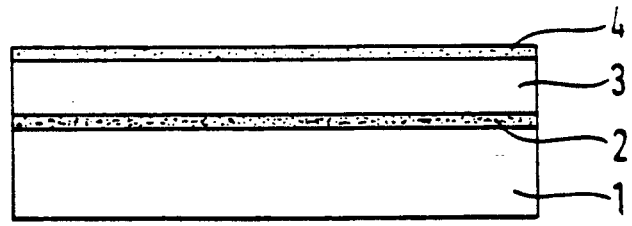
FIGS. 2 through 11 are views in cross-section of a semiconductor substrate after successive stages in manufacturing a laser by a method in accordance with the present invention.

Blocking lateral layers 106 and 107 are then grown by a selective method, the mask 150 preventing deposition on top of the laser stripe 102A (FIG. 1D). The mask is then removed (FIG. 1E). A new dielectric layer 152 is then deposited to form a contact localization layer (FIG. 1F). A window 153 is formed in this layer on top of the laser stripe 102A by photo-etching methods which are well known in themselves and which do not require accurate positioning of a mask. The tolerable positioning error is approximately 0.5 micrometer.

The positioning of this mask is the realignment previously referred to.

A metal layer 154 is then deposited and makes localized contact with the partial contact layer 104A.

A method in accordance with the invention includes various steps which are, with regard to the functions described, common to it and to the known method as just described in outline. To clarify the essential differences between the two methods, these common steps will first be generally described with reference to FIGS. 2 through 11.

With reference to these common steps, the first step of this method in accordance with the present invention is to form a lower confinement layer 1 of semiconductor base material having a first type of conductivity. It then comprises the following steps (see FIG. 2):

Growth of an active layer 2 of an active material.

Growth of an upper confinement layer 3 of said base material having the second type of conductivity.

Growth of an upper contact layer 4 of a contact material.

Figure 3:
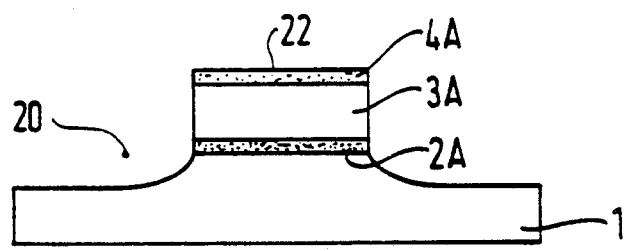

Etching to define the boundaries of the laser stripe (see FIG. 3). This etching locally eliminates at least the active layers and the upper confinement layer by etching two valleys 20 one on each side of a laser stripe 2A constituted by a remaining portion of said active layer. Said stripe and the layers on top of it form an upstanding mesa 22 between the two valleys.

Figure 4:
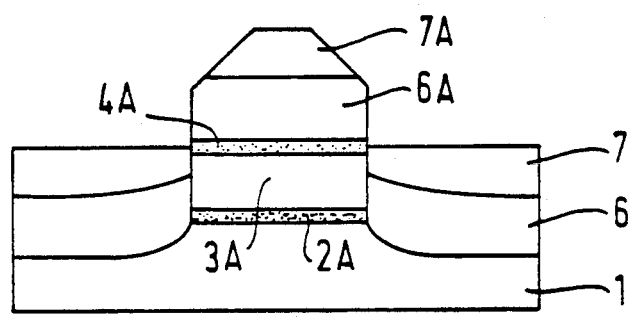

Growth of lateral layers 6, 7 surrounding said laser stripe (see FIG. 4).

Figure 5:
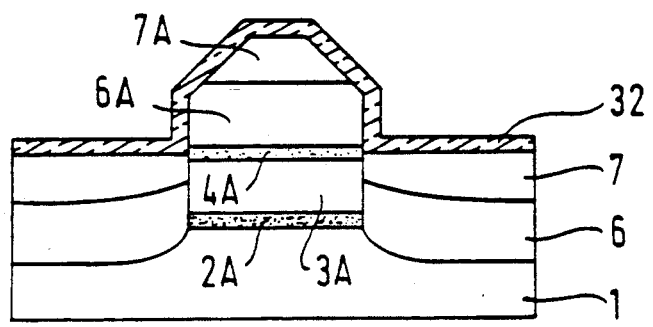

Forming a contact localizing layer 32 on the surface of said lateral and confinement layers (see FIG. 5).

Figure 9:
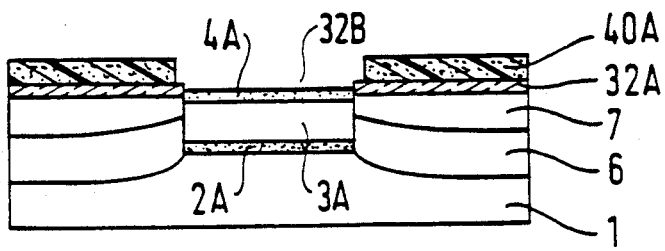

Forming a contact window 32B in said contact localizing layer on top of said laser stripe 2A (see FIG. 9).

Figure 11:
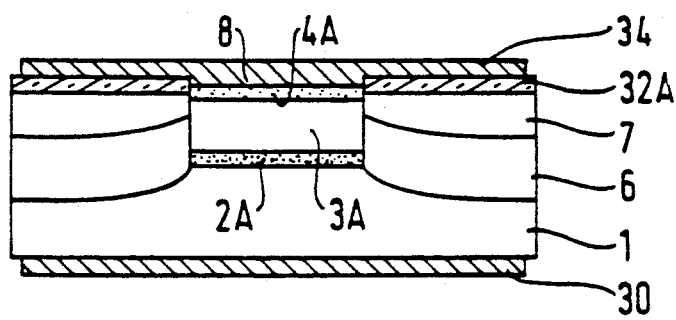

Forming a lower electrode 30 and an upper electrode 34 respectively on the bottom and on the top of said lower and upper confinement layers (see FIG. 11).

The refractive indices, types of electrical conductivity and resistivity of these active and lateral confinement layers and the positions of the edges of the current localizing window are selected in parts at least of said layers to establish optical confinement in said laser stripe and so that the passage of an energizing electrical current between said confinement layers using these electrodes is localized through said laser stripe and injects thereinto charge carriers enabling amplification of light to be emitted by the laser.

Provisions specific to this method in accordance with the present invention will now be generally described:

The step of growing the lateral layers employs a non-selective growth method which grows the lateral layer material not only in the valleys 20 to form the lateral layers 6 and 7 but also on top of the contact layer 4A to form a parasitic projection 6A, 7A above the mesa 22 (FIG. 4).

Figure 10:
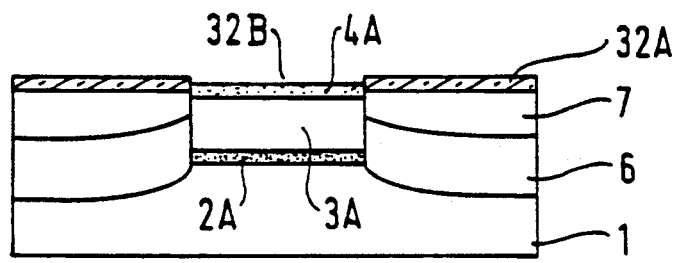

The contact localizing layer growth step then forms this layer 32 on the surface of the lateral layers 6, 7 and the projection 6A, 7A (FIG. 5). The next step is a projection removal step which removes the projection and the part of the contact localizing layer on the surface of the projection to form the contact window 32B (FIG. 10).

The contact localizing layer 32 is preferably formed by depositing a dielectric material, the upper electrode 34 being deposited onto this layer.

Figure 6:
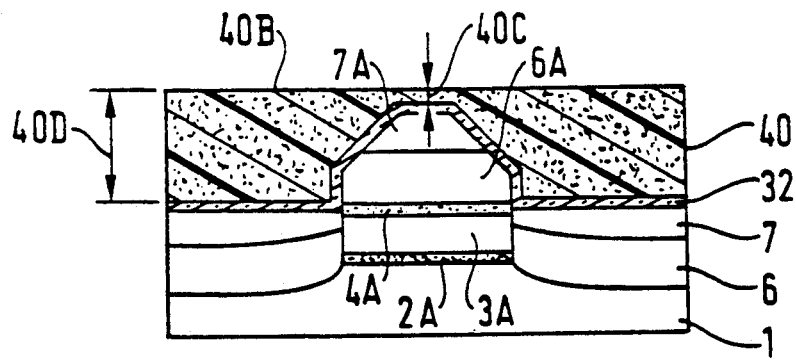
Figure 7:
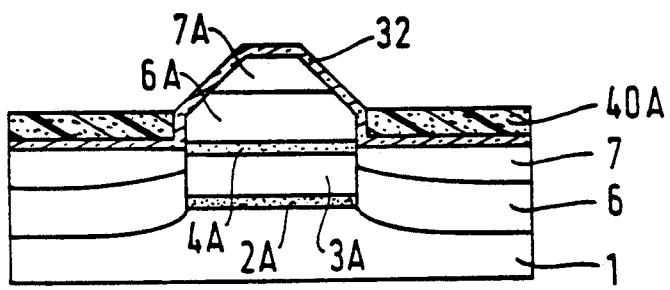

The projection removal step preferably comprises the following steps:

Resin is deposited to form a protective resin layer 40 which covers the lateral layers 6, 7 and the projection 6A, 7A and which has a regular upper surface 40B, in other words its thickness is reduced in an area 40C above the projection and normal in an area 40D above the lateral layers (FIG. 6).

Careful removal of the protective resin to remove a limited thickness thereof greater than said reduced thickness and less than said normal thickness so as to uncover the projection 6A, 7A and leave a residual resin layer 40A on the lateral layers 6, 7.

Figure 8:
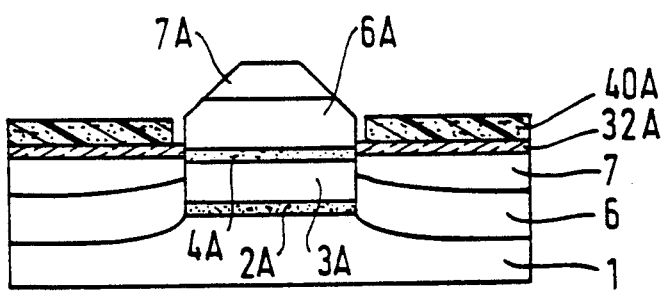

Chemically attacking the contact localizing layer using a dielectric attacking medium against which the residual resin layer 40A provides protection so that a residual contact localizing layer 32A remains only on top of the lateral layers 6, 7 (FIG. 8).

Chemically attacking the projection 6A, 7A using a semiconductor attacking medium against which the protective resin and/or the dielectric material of the layer 32 provide(s) protection. Attack limiting means are provided to prevent removal of the upper confinement layer. The attacking medium is preferably chosen so that it does not attack said contact material so that the part 4A of the upper contact layer which remains on top of the laser stripe 2A constitutes said attack limiting means (FIG. 9).

Preferred embodiments of the steps generally described above will now be more specifically described.

Onto the n-doped InP lower confinement layer 1 are deposited:

An active layer 2 of GaInAsP between 10 and 300 nm thick, for example.

An upper confinement layer 3 of p-doped InP 2000 nm thick.

A lower contact layer 4 of InGaAs 300 nm thick.

The stripe boundary definition etching is carried out using known techniques such as so-called "dry" etching, plasma or ionic etching, etc.

The respectively p-doped and n-doped lateral layers 6 and 7 are then grown to bury the laser stripe 2A. The material of these layers is indium phosphide InP. The growth method used is non-selective. It may be the molecular jet epitaxy (MJE) method or the metalorganic chemical vapor deposition (MOCVD) method operated at atmospheric pressure. This non-selective method grows a projection in the form of stripes 6A and 7A on the mesa 22. Note that the layers 6 and 7 may be replaced with a succession of layers including a layer of iron-doped semi-insulative InP.

The contact localizing layer 32 which is then deposited (FIG. 5) is a thin layer of silicon nitride $Si_3N_4$. It may be 200 nm thick, for example.

The protective resin layer 40 is then formed (FIG. 6). This layer is 4 micrometers thick, for example. This thickness is sufficient to cover the projection 6A, 7A which is 2.5 micrometers high, for example. This layer is formed by a conventional method which deposits excess resin which is removed by centrifuging.

The resin is then carefully removed (FIG. 7) using an oxygen plasma to uncover the projection 6A, 7A.

The contact localizing layer 32 is then attacked using a carbon tetrafluoride $CF_4$ plasma to remove it from the top and sides of the projection (FIG. 8). The projection is then removed by chemical attack using a semiconductor attacking medium comprising a liquid mixture of four parts hydrochloric acid HCl to one part water by volume (FIG. 9).

The remaining resin layer 40A is then removed (FIG. 10).

The upper electrode 34 is then formed by successively depositing a 100 nm layer of titanium, a 50 nm layer of platinum and a 250 nm layer of gold.

The lower electrode 30 is formed by conventional techniques.

In a variant of the method just described the projection 6A, 7A is used as a protective mask during implantation or diffusion of impurities into the semiconductor material.

Figure 12:
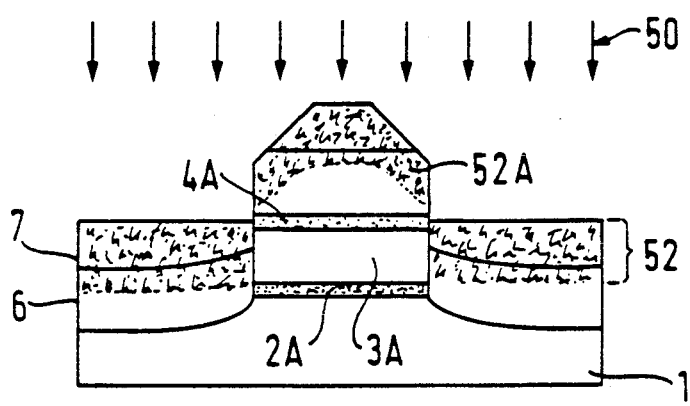
FIG. 12 is a view in cross-section of a semiconductor substrate after one step in the manufacture of a laser by a method which is a variant of the method of FIGS. 2 through 11.

Referring to FIG. 12, an impurity introduction step is carried out between the lateral layer growth step and the projection removal step to introduce impurities into the lateral layers 6, 7 and the projection 6A, 7A. The depth to which impurities are introduced does not significantly exceed the height of the projection so that after the projection is removed the impurities remain selectively in the lateral layers. The impurities are intended to increase the electrical resistivity of the lateral layer material to render it semi-insulative, for example.

The impurities are protons implanted by proton bombardment 50. They form a semi-insulative layer 52 in the lateral layers 6 and 7 parts 52A of which extend into the projection 6A, 7A.

This semi-insulative layer can reinforce the action of the dielectric contact localizing layer 32 which is deposited subsequently. If appropriate, it can itself constitute the contact localizing layer of the present invention.

There is claimed:

1. Method of manufacturing a semiconductor laser comprising the steps:

etching a semiconductor structure to form crystalline protuberance including a laser stripe, then using an epitaxial non-selective growth method to form crystalline layers including at least one lateral layer at each side of said protuberance and a parasitic projection on top of said protuberance, then forming a dielectric contact localizing layer on said lateral layers and on said projection, then removing said projection with a part of the contact localizing layer on top of said projection to thereby form a contact window on said top, and then depositing a conductive layer on said dielectric contact localizing layer to thereby form an electric contact through said contact window.

2. Method according to claim 1 wherein said etching step is preceded by the steps:

forming a lower confinement layer consisting of a semiconductor base material with a first type of conductivity, then epitaxially growing an active layer, and then epitaxially growing an upper confinement layer of said base material having the second type of conductivity, said etching step locally eliminates portions of at least said active layer and said upper confinement layer by etching two valleys one on each side of a laser stripe constituted by a remaining portion of said active layer to thereby define the boundaries of said laser stripe, said laser stripe and the layers on top of it forms said protuberance whose upper surface constitutes a mesa which extends between said two valleys, said lateral layers surround said laser stripe, the refractive indices, types of electrical conductivity and resistivity of said active, lateral and confinement layers are selected in at least parts of said layers to establish optical confinement in said laser stripe so that an energizing electrical current flowing between said confinement layers and passing through said laser stripe enables light amplification to take place therein, said contact localizing layer is grown on the surface of said lateral and confinement layers, said contact window is formed above said laser stripe, lower and upper energizing current electrodes are respectively formed on the bottom and on the top of said lower and upper confinement layers, the contact area of said upper electrode being defined by said contact window so that said energization current is localized through said laser stripe, and said step of using an epitaxial non-selective growth method forms crystalline layers in said valleys and on said upper confinement layer.

3. Method according to claim 2 wherein said contact localizing layer is formed by depositing a dielectric material, and said upper electrode is deposited on said contact localizing layer.

4. Method according to claim 2 wherein said step of removing said projection comprises the following steps:

depositing resin to form a protective resin layer covering said lateral layers and said projection and which has a regular upper surface whereby it has a reduced thickness above said projection and a normal thickness above said lateral layers, carefully removing said protecting resin to eliminate a restricted thickness thereof greater than said reduced thickness and less than said normal thickness so as to uncover said projection and to leave a residual resin layer on said lateral layers, chemically attacking said contact localizing layer using a localizing layer attacking medium against which said residual resin layer provides protection so that the contact localizing layer remains only on top of said lateral layers in the form of a residual contact localizing layer, and chemically attacking said projection using a semiconductor attacking medium against which said protective resin and/or said contact localizing layer provide(s) protection, attack limiting means being provided so that such attack does not remove said upper confinement layer.

5. Method according to claim 4 further comprising the step:

after growing said upper confinement layer and before etching said laser stripe, depositing a contact material having a different intrinsic composition than said base material, said semiconductor attacking medium being selected so that it does not attack said contact material whereby the part of the upper contact layer which remains on top of said laser stripe constitutes said attack limiting means.

6. Method according to claim 5 wherein
said base material and said lateral layers have a binary intrinsic composition and
said active material and said contact material have a ternary and/or quaternary intrinsic composition.

7. Method according to claim 6 wherein
said base material and said lateral layer material are indium phosphide or gallium arsenide and
said active material and said contact material are gallium and/or arsenic.

8. Method according to claim 1 further comprising the step of introducing impurities into the lateral layers and the parasitic projection to a depth not substantially exceeding the height of said projection so that after removal of said projection said impurities remain selectively in said lateral layers.

9. Method according to claim 8 wherein said impurities are chosen to increase the electrical resistivity in said lateral layers.

* * * * *